United States Patent [19]

Okahashi et al.

[11] Patent Number: 5,460,890
[45] Date of Patent: Oct. 24, 1995

[54] BIAXIALLY STRETCHED ISOTROPIC POLYIMIDE FILM HAVING SPECIFIC PROPERTIES

[75] Inventors: Masakazu Okahashi; Akimitsu Tsukuda; Tsuneyoshi Miwa, all of Nagoya, Japan; James R. Edman, Circleville, Ohio; Charles M. Paulson, Jr., Wilmington, Del.

[73] Assignee: E. I. Du Pont de Nemours and Company, Wilmington, Del.

[21] Appl. No.: 841,807

[22] Filed: Feb. 26, 1992

[30] Foreign Application Priority Data

Oct. 30, 1991 [JP] Japan ................. 3-284490

[51] Int. Cl.⁶ ................................. B32B 15/08
[52] U.S. Cl. ........................ 428/458; 428/473.5
[58] Field of Search .................. 428/473.5, 458

[56] References Cited

U.S. PATENT DOCUMENTS

| | | | |
|---|---|---|---|
| 4,496,794 | 1/1985 | Darms et al. | 174/68.5 |
| 4,522,880 | 6/1985 | Klostermeier et al. | 428/332 |
| 4,675,246 | 6/1987 | Kundinger et al. | 428/336 |
| 4,725,484 | 2/1988 | Kumagawa et al. | 428/220 |
| 4,869,861 | 9/1989 | Inoue et al. | 264/204 |
| 4,937,133 | 6/1990 | Watanabe et al. | 428/209 |
| 5,137,762 | 8/1992 | Aizawa et al. | 428/35.8 |

FOREIGN PATENT DOCUMENTS

| | | |
|---|---|---|
| 678689 | 9/1966 | Belgium . |
| 0483376 | 6/1992 | European Pat. Off. . |
| 0464371 | 8/1992 | European Pat. Off. . |
| WO91/17880 | 11/1991 | WIPO . |

Primary Examiner—D. S. Nakarani
Assistant Examiner—H. Thi Lê

[57] ABSTRACT

An isotropic, biaxially stretched polyimide film prepared by casting a solution of a polyamic acid precursor in an organic solvent containing a cyclization catalyst and dehydrating agent onto the surface of a support, imidizing the polyamic acid to give a continuous self-supporting gel film containing 5–50% by weight of solids, stretching the gel film in the machine direction (MD) at a ratio of 1.1–1.9, and stretching in the transverse direction (TD) with respect to the machine direction so as to maintain a TD/MD stretch ratio of from 0.9 to 1.3.

3 Claims, No Drawings

BIAXIALLY STRETCHED ISOTROPIC POLYIMIDE FILM HAVING SPECIFIC PROPERTIES

BACKGROUND OF THE INVENTION

The present invention relates to a polyimide film for use as a support for electrical circuit boards to which a metal layer is either laminated or deposited and to a process for the manufacture thereof. Specifically, it relates to a biaxially stretched polyimide film having excellent dynamic properties and in-plane isotropy, as well as improved dimensional stability, and a process for the manufacture thereof.

Due to its high heat resistance and good electrical insulation properties, polyimide film can be used as an electrical insulation material in a broad range of industrial applications which require heat resistance. More particularly, polyimide film can be used as a support for an electrical circuit board to which a metal layer is subsequently laminated or deposited and wherein an electrical part, such as an IC chip, can be soldered to the metal layer, thereby miniaturizing the electrical wiring. An electrical circuit board having a polyimide film support can also be folded to form a long continuous electrical circuit board to such an extent that polyimide film has come to occupy an important position as a support for electrical insulation applications. However, due to the diversification in the applications of electrical circuit boards and the increased density in the number of wirings, the polyimide film requires improvements in dynamic properties, in-plane isotropy, and dimensional stability for use as an electrical insulation support. In order to meet these requirements prior art proposals have been made based on improving physical properties of the polyimide film by stretching or by improving dimensional stability by the use of a copolyimide, or the like.

For example, Japanese Patent Application Publication Kokai 63-297029, discloses a process for improving the dynamic properties of an aromatic polyimide shaped article, comprising cyclizing and imidizing a solution of an aromatic polyamic acid in an organic polar solvent containing an imidization agent, shaping to give a self-supporting shaped article containing 20–87% by weight of volatile solvent and stretching the shaped article at a stretch ratio of at least 1.3 and heat-treating the stretched article at a temperature of at least 150° C. The prior art process improves dimensional stability in the stretching direction, but it adversely affects not only the dimensional stability in the direction perpendicular to the stretching direction, but also the dynamic property of in-plane anisotropy.

Japanese Patent Application Publication Kokai 44- 20878, discloses stretching a polyamic acid-imide gel film wherein the ratio of imide units to polyamic acid precursor units is at least 30:70 undirectionally at 20°– 550° C. by at least 5%. However, the prior art reference fails to disclose how to reduce in-plane anisotropy of the film.

U.S. Pat. No. 3,619,461, issued on Nov. 9, 1971, discloses a process for preparing a polyimide film by immersing a film having a volatiles content of from 10 to 15% in a volatile liquid and heating and stretching the treated film to increase the orientation in at least one direction. In the invention process, the polyimide film is not immersed in a volatile liquid prior to stretching.

Japanese Patent Application Publication Kokai 64- 16833, Kokai 64-16834, Kokai 1-131241 and Kokai 62- 125329, and many similar proposals, disclose the use of special copolyimides for improving the dimensional stability of polyimide films. However, these disclosures fail to disclose a way to reduce in-plane anisotropy of the polyimide film.

The object of the present invention is to provide a polyimide film having improved dimensional stability and dynamic properties and excellent in-plane isotropy, and to a process for preparing said film.

SUMMARY OF THE INVENTION

According to the present invention there is provided a process for manufacturing an isotropic, biaxially stretched polyimide film comprising the steps of:

(a) casting a solution of a polyamic acid precursor of the polyimide in an organic solvent containing a cyclization catalyst and a dehydrating agent onto the surface of a support;

(b) imidizing said polyamic acid to form a continuous self-supporting gel film containing from 5–50% by weight of solids;

(c) stretching said gel film at a stretch ratio of from 1.1–1.9 in the machine direction (MD) wherein the stretching rate is controlled using a tension isolation means; and (d) stretching said gel film in the transverse direction (TD) with respect to the machine direction (MD) so as to maintain a TD/MD stretch ratio of from 0.9 to 1.3.

A further embodiment of the present invention relates to an isotropic, biaxially stretched polyimide film having an in-plane anisotropy index of not more than 20 and an average in-plane coefficient of thermal expansion (CTE) at least 10% lower than the unstretched film.

A still further embodiment of the invention relates to a laminate of the isotropic, polyimide film and a metal foil wherein the metal is bonded to the polyimide film either with or without the use of an adhesive.

DETAILED DESCRIPTION OF THE INVENTION

The polyamic acid precursor used to prepare the polyimide of this invention is derived from the reaction of an aromatic tetracarboxylic acid and an aromatic diamine and is composed of repeating units represented by the following Formula (1):

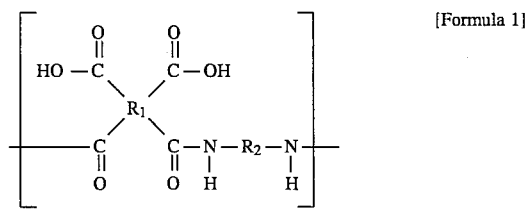

[Formula 1]

wherein $R_1$ is a tetravalent organic group having at least one aromatic ring and wherein each of the two carboxyl groups bonded to $R_1$ are bonded to carbon atoms of $R_1$ which are adjacent to carbon atoms bonded to an amide group of the aromatic ring; $R_2$ is a divalent organic group having at least one aromatic ring and wherein the amino groups are bonded to carbon atoms of the $R_2$ aromatic ring.

The aromatic tetracarboxylic acids used in the polyimide films of the invention are, for example, pyromellitic acid, 3,3',4,4'-biphenyl tetracarboxylic acid, 2,3',3,4'-biphenyl tetracarboxylic acid, 3,3',4,4'-benzophenone tetracarboxylic acid, 2,3,6,7-naphthalene tetracarboxylic acid, 2,2-bis(3,4-dicarboxyphenyl)ether, pyridine-2,3,5,6-tetracarboxylic acid, 4,4'-oxydiphthalic acid and their amide-forming derivatives. Acid anhydrides of these compounds are preferably used in preparing the polyamic acids.

Aromatic diamines used in the polyimide films of the invention include, for example, paraphenylene diamine, metaphenylene diamine, benzidine, paraxylylene diamine, 4,4'-diaminodiphenylether, 4,4'-diaminodiphenylmethane, 4,4'-diaminodiphenylsulfone, 3,3'-dimethyl-4,4'-diaminodiphenylmethane, 1,5-diaminonaphthalene, 3,3'-dimethoxybenzidine, 1,4-bis(3-methyl- 5-aminophenyl)benzene, 1,2-bis(4-aminophenoxy)benzene, 1,3-bis(4-aminophenoxy)benzene, 1,2-bis(3-aminophenoxy)benzene, 1,3-bis(3-aminophenoxy)benzene, 1,4-bis(4-aminophenoxy)benzene, and their amide-forming derivatives.

A particularly preferred polyimide film of the invention is derived from pyromellitic dianhydride and 4,4'-diaminodiphenylether.

Aromatic tetracarboxylic acids and aromatic diamines particularly suitable for preparing a polyamic acid precursor for manufacturing the polyimide film according to the process of this invention, also include combinations of pyromellitic acid dianhydride and 4,4'-diaminodiphenylether; and 3,3',4,4'-biphenyltetracarboxylic acid dianhydride and paraphenylene diamine. Particularly preferred herein are polyimide films derived from 30 to 50 mole % of 3,3',4,4'-biphenyltetracarboxylic dianhydride, 50 to 70 mole % of pyromellitic dianhydride, 60 to 80 mole % of paraphenylene diamine, and 20 to 40 mole % of 4,4'-diaminodiphenylether. Gel films prepared from polyamic acids generated from such combinations can satisfactorily attain the effect of this invention, i.e. they can be readily biaxially stretched to TD/MD stretch ratios ranging from 0.9 to 1.3, providing polyimide films having excellent in-plane isotropy and low coefficients of thermal expansion.

Organic solvents which can be used in this invention are specifically, for example, organic polar amide solvents such as N,N-dimethylformamide, N,N-dimethylacetamide, N-methyl-2-pyrrolidone, and the like. These organic solvents may be used singly or in mixtures of two or more, or else in combination with nonsolvents such as benzene, toluene, and xylene. The solutions of the polyamic acid in organic solvents used in this invention contain from 5–50% by weight, preferably 10–30% by weight, of polymer solids and have a Brookfield viscosity at 20° C. of 100–20,000 poises, preferably 1,000–10,000 poises and form stable solutions. The polyamic acid in the organic solvent solution may be partially imidated. A small amount of an inorganic additive for imparting slip and handling properties to the polyimide film may also be included in the polyamic acid solution.

According to the invention process, at least one aromatic tetracarboxylic acid component and at least one aromatic diamine component are polymerized at an approximately equimolar ratio with one component being not more than 10 mole %, preferably not more than 5 mole %, in excess over the other component. The polymerization reaction is carried out continuously for 10 minutes to 30 hours at temperatures ranging from 0°–80° C. in the organic solvent with agitation and/or mixing. Optionally, the polymerization reaction can be carried out by adding one or more of the components in portions. Although there is no particular limitation as to the sequence of adding the two reaction components, it is preferred to add the aromatic tetracarboxylic acid component to a solution of the aromatic diamine component. Vacuum defoaming the polymerization reaction mixture can be used to prepare a stable solution of a polyamic acid in the organic solvent. A small amount of a terminal-blocking agent may also be added to the aromatic diamine prior to the polymerization reaction in order to regulate the reaction rate of the polymerization reaction.

The cyclization catalysts used in this invention process are typically, for example, aliphatic tertiary amines such as trimethylamine, triethylene diamine, and the like, and heterocyclic tertiary amines such as isoquinoline, pyridine, beta-picoline, and the like. Preferably, at least one amine is a heterocyclic tertiary amine.

The dehydrating agents used in this invention process are typically, for example, aliphatic carboxylic acid anhydrides, such as acetic anhydride, propionic anhydride, butyric anhydride, and the like, and aromatic carboxylic acid anhydrides, such as benzoic anhydride, and the like. Acetic anhydride and/or benzoic anhydride are preferred.

The amounts of the cyclization catalyst and the dehydrating agent used with respect to the polyamic acid are preferably regulated according to the following Equations (1) and (2):

$$\frac{\text{Concentration of Cyclization Catalyst (moles)}}{\text{Concentration of Polyamic Acid (moles)}} = 0.5\text{-}8 \quad \text{[Equation 1]}$$

$$\frac{\text{Concentration of Dehydrating Agent (moles)}}{\text{Concentration of Polyamic Acid (moles)}} = 0.1\text{-}4 \quad \text{[Equation 2]}$$

Optionally, a gel-retarder such as acetyl acetone, or the like, may also be included.

Typical processes for manufacturing polyimide film from a solution of a polyamic acid in an organic solvent include a thermal cyclization process, which comprises casting a solution of a polyamic acid in an organic solvent containing no cyclization catalyst or dehydrating agent from a slit die onto the surface of a support to form a film, heating and drying to form a self-supporting film on the support, peeling the film from the support, and further drying/heat treating the film at high temperatures to effect imidation. Alternatively, a chemical cyclization process can be used which comprises casting a solution of a polyamic acid in an organic solvent containing a cyclization catalyst and a dehydrating agent from a slit die onto the surface of a support, partially imidating on the support to give a self-supporting gel film, peeling the film from the support, and drying and heat treating to effect imidation.

The thermal cyclization process is advantageous in not requiring any apparatus for incorporating the cyclization catalyst or dehydrating agent, but requires a long heating and drying time to generate a self-supporting film, which is subsequently peeled from the support. The film also contains too high of a ratio of polymer solids to allow stable film stretching. Therefore, the thermal process is not suitable for use in this invention.

The chemical cyclization process, although requiring an apparatus for incorporating the cyclization catalyst and dehydration agent in the solution of the polyamic acid in an organic solvent, is a preferred process for manufacturing polyimide film according to this invention. The chemical process provides a self-supporting gel film within a short time, provides a low ratio of solids in the gel film peeled from the support, and permits stretching to the preferred stretch ratio. A process for manufacturing a polyimide film closely resembling a thermal cyclization process by decreasing the concentration of the cyclization catalyst and dehydrating agent may be considered as a chemical cyclization process, since it still contains some cyclization catalyst and dehydrating agent.

The methods for incorporating the cyclization catalyst and the dehydrating agent into the solution of a polyamic acid in the organic solvent include a process of mixing the solution of a polyamic acid in an organic solvent, cyclization catalyst, and dehydrating agent in a rotary mixer; a process for feeding the solution of a polyamic acid in an organic solvent to a static mixer while introducing the cyclization catalyst and dehydrating agent immediately before the static mixer; a process for casting the solution of a polyamic acid in an organic solvent onto a support, followed by contacting with the cyclization catalyst and dehydration agent, and the like. However, in terms of the concentrations of the cyclization catalyst and dehydration agent used, as well as their uniformity, it is preferred to mix the cyclization catalyst, dehydrating agent, and the solution of a polyamic acid in an organic solvent and feed the liquid mixture through a slit die. In order to insure formation of a stable liquid mixture, said mixed liquid must have its solids concentration and temperature controlled to maintain a viscosity of 100–10,000 poises. Cyclization of the polyamic acid can also result in a viscosity which is too high to allow extrusion of the liquid mixture through the slit die, therefore, the solution should be maintained at a low temperature (for example, −10° C.).

The liquid mixture is cast from the slit die in the form of a continuous film onto the surface of a heated support. The polyamic acid undergoes a ring closure reaction on the support to give a self-supporting gel film which is then peeled from the support. The support may be a metal rotating drum or endless belt, the temperature of which is regulated by a liquid or gas heating medium and/or radiant heat from an electrical heater, or the like.

The gel film undergoes a ring closure reaction upon heating to 30°–200° C., preferably 40°–150° C., from the heat received from the support and/or from an external heat source, such as hot air, an electrical heater, or the like, to form a self-supporting film which is peeled from the support. The rapid heating of a polyamic acid film which has not fully progressed in the ring closure reaction fails to give a self-supporting gel film, so that the heating temperature must be carefully controlled.

The gel film peeled from the support is first stretched in the machine direction (MD) while controlling the stretching rate using a tension isolation means. The stretching is carried out at a stretch ratio of from 1.1–1.9, preferably 1.1–1.6, at temperatures not higher than 150° C. The stretching rate of the tension isolation means is regulated by the drive source and a speed regulator. The tension isolation means must have a gripping strength sufficient to regulate the gel film moving rate. Examples of tension isolation means include nip rolls comprising a combination of metal and rubber rolls and/or vacuum suction rolls, where the number of rotating rolls is selected depending upon each roll's gripping force. The gripping force required is from 50–1,000 kg/m with respect to the gel film width. A stretch ratio in the machine direction of the gel film of less than 1.1 gives a small stretching effect and fails to improve dynamic properties. As the stretch ratio in the machine direction is increased, the stretching effect is increased, thereby improving the dynamic properties and dimensional stability in the machine direction. However, because the range of the subsequent stretch ratio in the transverse direction is limited by gel film breakdowns, the stretch ratio in the machine direction must be from 1.1–1.9, preferably 1.1–1.6, to improve the in-plane isotropy, which is one of the objectives of this invention.

The gel film stretched in the machine direction is subsequently introduced into a tenter frame where it is gripped at both transverse edges. Various means may be employed to grip the film, including various types of pins, clips, clamps, and rollers. Most preferably, gripping of the film for stretching in the transverse direction is obtained by clips which are mounted on an endless chain on each side of the film. The gel film is then stretched in the transverse direction due to outward movement of the tenter clips, the volatile organic solvent is removed by vaporization and the film is heat treated to give a biaxially stretched polyimide film. The transverse stretching is carried out at temperatures not more than 400° C., preferably not more than 350° C., at a TD/MD stretch ratio, i.e. a stretch ratio defined by the following Equation (3), of 0.9–1.3, preferably 1.0–1.3.

$$\frac{\text{Stretch Ratio in the Transverse Direction } (TD)}{\text{Stretch Ratio in the Moving Direction } (MD)} = 0.9\text{–}1.3 \quad \text{[Equation 3]}$$

The TD/MD stretch ratio is a very critical factor for improving the in-plane isotropy of the film, which is one of the objectives of this invention. A TD/MD stretch ratio of less than 0.9 results in a stretching effect in the machine direction which is too high and a TD/MD stretch ratio exceeding 1.3 results in a stretching effect too high in the transverse direction, thereby causing the film in-plane isotropy to deviate from the preferred range.

In a further embodiment of the invention process, rather than stretching the gel film in the moving direction (MD) followed by stretching in the transverse direction (TD), the gel film can be stretched simultaneously in both the moving direction (MD) and the transverse direction (TD).

The stretchability of the gel film is strongly dependent upon its solids concentration. As the solids concentration approaches 60% by weight, stretching of the gel film becomes more difficult. Such a film if stretched to a stretch ratio of 1.05 in the moving direction cannot undergo transverse stretching due to the breakdown of the gel film. Therefore, the gel film peeled from the support must have a solids concentration of not more than 50% by weight. In order to generate a self-supporting gel film, the solids concentration should preferably be 5–50% by weight.

The gel film in the tenter frame is dried and heat treated by means of hot air and/or radiant heat from an electrical heater, or the like, at a drying temperature of 100°–400° C. and a heat treatment temperature of 350°–500° C. Too rapid heating of the gel film results in the rapid removal of volatile matter contained in the film, generates spongy defects on the resultant biaxially stretched polyimide film surface and results in a loss of film smoothness.

The resultant biaxially stretched polyimide film thus prepared has its molecular chains uniformly oriented in the plane of the film which results in a lowering of the CTE according to Equation (4).

$$\frac{CTE \text{ Unstretched Film} - CTE \text{ Biaxially Stretched Film}}{CTE \text{ Unstretched Film}} \times 100 \quad \text{[Equation 4]}$$
$$\text{Greater than or equal to } 10\%$$

The resultant biaxially stretched polyimide film also has an in-plane anisotropy index defined by the following Equation (5) of not more than 20, thus showing excellent in-plane isotropy.

$$(\text{Sonic Wave Propagation Rate in the Direction of Maximum Orientational Angle})^2 \quad \text{[Equation 5]}$$

-continued $$\frac{\text{(Sonic Wave Propagation Rate in the Direction of minimum Orientational Angle)}^{2-}}{\text{(Sonic Wave Propagation Rate in the Direction of Maximum Orientational Angle)}^2}$$

$$\frac{\text{(Sonic Wave Propagation Rate in the Direction of minimum Orientational Angle)}^{2+}}{2} \times$$

$$100 = \text{In-Plane Anisotropy Index } (AI \text{ Value})$$

The biaxially stretched polyimide film prepared by the process of this invention is in-plane oriented, has a coefficient of thermal expansion 10% less than unstretched film, and has an in-plane anisotropy index of not more than 20 over the entire film surface, which minimizes the extent of curling of flexible metal-clad boards.

The present invention improves the dynamic properties of a polyimide film and, simultaneously, its in-plane isotropy and dimensional stability. Moreover, the polyimide film can be readily adapted to diversified electrical circuit board applications requiring increased wiring densities by laminating or depositing metal foil to the polyimide film.

The following methods were used to measure the properties of the polyimide films prepared according to the process of the invention.

(1) In-plane Anisotropy Index

Anisotropy was measured using a Sonic Sheet Tester SST-250 Model manufactured by the Nomura Shoji Company. A specimen was prepared by stacking six sheets of 25 micron film and accurately cutting out a piece measuring 250 mm in the machine direction and 170 mm in the transverse direction. The specimens representing the center of the film were sampled from the center in the transverse direction, while edge specimens were sampled from a center location 100 mm from the edge.

The sonic wave propagation rate through the film samples was measured at 10° intervals. The data was correlated in terms of a second order curve so as to obtain the distribution of orientation throughout the entire circumference, from which the maximum orientation angle, minimum orientation angle, and sonic wave propagation rates at the maximum and minimum orientation angles were determined.

The in-plane anisotropy index (AI value) was calculated from Equation (5) based on the sonic wave propagation rate in the direction of the maximum orientation angle (peak value max), and the rate of sonic propagation in the direction of the minimum orientation angle (peak value min.).

(2) Coefficient of Thermal Expansion (CTE)

CTE was measured using an Orton Dilatometer equipped with a Barber Colman programmer-controller.

A characteristic expansion curve was obtained by heating a rigid film sample to 300° C. at a heating rate of 5°–20° C./min, cooling the sample to room temperature and then reheating the sample to 300° C. The CTE is the expansion of the film in parts per million per °C. measured between 150° and 250° C. upon reheating the sample. The rigid sample of 25 micron film was made by winding a 2.5×13 cm strip into a cylinder approximately 4 mm in diameter and maintaining the cylindrical shape with wire ties.

The average coefficient of thermal expansion was obtained from the coefficients of thermal expansion measured in the direction of the minimum and maximum orientation angles, i.e., average CTE=minimum (CTE)+ maximum (CTE)/2

(3) Curling

A specimen 250 mm long in the machine direction and 50 mm long in the transverse direction was cut out from a flexible polyimide copper clad laminate and was placed on a table to measure its curling height. The extent of curling was evaluated by measuring the heights at the four corners of the flexible laminate, $h_1$, $h_2$, $h_3$ and $h_4$ and calculating the extent of curling by Equation (6).

$$\frac{h_1 + h_2 + h_3 + h_4}{4} = \text{Extent of Curling} \qquad \text{[Equation 6]}$$

The extent of curling was rated as follows:

Small: less than 10 mm

Medium: 10 mm or more, but less than 30 mm

Large: 30 mm or more.

The significance of the extent of curling is an empirical measure and indicates the ease of incorporating a flexible printed circuit baseboard into an electrical device:

Small: Easily incorporated

Medium: Can be incorporated with some effort

Large: Incorporated sometimes but with difficulty.

The advantageous properties of this invention can be observed by reference to the following examples which illustrate, but do not limit, the invention. All parts and percentages are by weight unless otherwise indicated.

EXAMPLE 1

To a solution of 20.024 kg (0.1 kmol) of 4,4'-diaminodiphenylether in 190.6 kg of dry N,N-dimethylacetamide was added while agitating at 20° C. in small portions 21.812 kg (0.1 kmol) of purified powdery pyromellitic dianhydride, followed by continuous stirring for one hour to give a clear polyamic acid solution. The solution had a viscosity of 3500 poises at 20° C. The polyamic acid solution was mixed with 2.5 moles of acetic anhydride with respect to the polyamic acid units and 2.0 moles of pyridine with respect to the polyamic acid units, while cooling to give a solution of the polyamic acid in the organic solvent. The resultant solution of the polyamic acid in the organic solvent was metered through a slit die and cast onto a metal drum at 90° C. to give a self-supporting gel film. The resultant gel film contained 21% by weight solids. The gel film was peeled from the metal drum and was stretched in the machine direction (MD) at a temperature of 65° C. between two sets of nip rolls, consisting of metal and silicone rubber rolls, followed by feeding the film to a tenter frame. The stretch ratio in the machine direction, that is, the ratios of the speeds of the metal drum, each set of nip rolls, and the tenter were adjusted to 1.12 for the ratio of the speed of the first set of nip rolls with respect to the speed of the metal drum, 1.23 for the second set of nip rolls, and 1.39 for the tenter. The film was stretched to a stretch ratio of 1.61 in the transverse direction in the tenter (TD/MD stretch ratio was 1.16), dried for 40 seconds at a temperature of 260° C., heat treated for one minute at 430° C., cooled for 30 seconds while allowing the film to relax, and cutting off the edges of the film to give a 1997 mm wide and 25 micron thick biaxially stretched polyimide film. The film had an average coefficient of thermal expansion of 27.5 ppm/°C. It also had an in-plane anisotropy index at the edge of 8, and an in-plane anisotropy index at the center of 7.

The polyimide film was subsequently coated with a polyester/epoxy type adhesive using a roll coater, followed by drying at 160° C. A piece of electrolytic copper foil was pressure-laminated onto the adhesive coated side of the film at 130° C., and cured for 24 hours to give a flexible polyimide copper clad sheet. The extent of curling of the copper clad sheet was rated as small.

EXAMPLE 2

Example 1 was repeated except that the ratio of the speed of the first set of nip rolls to that of the metal drum was 1.12, that of the second set of nip rolls was 1.23, and that of the tenter was 1.38, and the stretch ratio was 1.58 in the transverse direction (TD/MD stretch ratio was 1.14), to give a 2130 mm wide and 25 micron thick biaxially stretched polyimide film.

The film had a CTE of 27.5 ppm/°C. and an in-plane anisotropy index at the edge of 4, and an in-plane anisotropy index at the center of 4. A flexible polyimide copper clad sheet was obtained in a manner similar to that of Example 1. The curl rating of the sheet was small.

EXAMPLE 3

Example 1 was repeated except that the ratio of the speed of the first set of nip rolls to that of the metal drum was 1.09, that of the second set of nip rolls was 1.14, and that of the tenter was 1.22, and the stretch ratio was 1.30 in the transverse direction (TD/MD stretch ratio was 1.07) to give a 1898 mm wide and 75 micron thick biaxially stretched polyimide film.

The film had a CTE in the center of 31 ppm/°C., and an in-plane anisotropy index at the edge of 15 and an in-plane anisotropy index at the center of 10. A flexible polyimide copper clad sheet was obtained in a manner similar to that of Example 1. The sheet had a curling rating of medium.

Comparative Example 1

This example shows that film prepared using low TD/MD stretch ratios and without using nip rolls had a significantly higher anisotropy index at both the edge and the center and a 20% higher CTE than a film prepared according to Examples 1 and 2 of the invention.

Example 1 was repeated except that no nip rolls were used, the ratio of the speed of the tenter to that of the metal drum was 1.16 and the stretch ratio was 1.30 in the transverse direction (TD/MD ratio was 1.12) to give a 2000 mm wide and 25 micron thick biaxially stretched polyimide film. The film had an average CTE of 35 ppm/°C., an in-plane anisotropy index at the edge of 41, and an in-plane anisotropy index at the center of 10. A flexible polyimide copper clad sheet was prepared as described in Example 1 and had a curling rating of small for the center and large at the edge.

Comparative Example 2

This example shows that film prepared using lower TD/MD stretch ratios and without using nip rolls has a significantly higher anisotropy index at the edge than a film prepared according to Example 3 of the invention.

Example 3 was repeated except that nip rolls were not used, the ratio of the speed of the tenter to that of the metal drum was 1.14, and the stretch ratio was 1.25 in the transverse direction (TD/MD ratio was 1.10) to give a 2085 mm wide and 75 micron thick biaxially stretched polyimide film.

The film had an in-plane anisotropy index at the edge of 30 and an in-plane anisotropy index at the center of 5. The average CTE of the film was 35 ppm/°C. A flexible copper clad sheet was obtained in a manner similar to that of Example 1. The copper clad sheet had a curling rating of small at the center and large at the edge.

Comparative Example 3

This example shows that the CTE of film prepared from gel film which was not stretched, i.e., MDX=TDX= 1.0, and without using nip rolls, had a much higher CTE when compared to film prepared according to Examples 1 and 2 of the invention.

Example 1 was repeated except that the gel film was placed on a pin tenter frame to control both MD and TD stretching at 1.0. The film was too small to measure the anisotropy index. The average CTE was 40 ppm/°C.

The results obtained for Examples 1 to 3 and Comparative Examples 1 to 3 are summarized in Table 1.

TABLE 1

|  | Examples | | | Comparative Examples | | |
|---|---|---|---|---|---|---|
|  | 1 | 2 | 3 | 1 | 2 | 3 |
| Nip Rolls | Used | Used | Used | Not Used | Not Used | Not Used |
| Stretch Ratio in the Moving Direction (MD) | 1.39 | 1.38 | 1.22 | 1.16 | 1.14 | 1.0 |
| Stretch Ratio in the Transverse Direction (TD) | 1.61 | 1.58 | 1.30 | 1.30 | 1.25 | 1.0 |
| Ratio of Stretch Ratios (TD/MD) | 1.16 | 1.14 | 1.07 | 1.12 | 1.10 | 1.0 |
| Anisotropy Index (Center) | 7 | 4 | 10 | 10 | 5 | — |
| Anisotropy Index (Edge) | 8 | 4 | 15 | 41 | 30 | — |
| Film Thickness (microns) | 25.0 | 25.0 | 75.0 | 25.0 | 75.0 | 25.0 |
| Average Coefficient of Thermal Expansion (ppm/°C.) | 27.5 | 27.5 | 31.0 | 35.0 | 35.0 | 40.0 |
| Extent of Curling | Small | Small | Medium | Small to Large | Small to Large | — |

What is claimed is:

1. An isotropic, biaxially stretched polyimide film comprising pyromellitic dianhydride and 4,4'-diaminodiphenylether having an in-plane anisotropy index of not more than 20 and an average coefficient of thermal expansion (CTE) of less than 31 ppm/°C.

2. The isotropic, biaxially stretched polyimide film of claim 1 laminated to a metal foil with a heat resistant polyester/epoxy adhesive.

3. The isotropic, biaxially stretched polyimide film of claim 2 laminated to a metal foil, wherein the metal is copper.

* * * * *